United States Patent
Yuan et al.

(10) Patent No.: US 7,313,002 B2
(45) Date of Patent: Dec. 25, 2007

(54) SHIELDING STRUCTURE FOR A CONTROL MODULE

(75) Inventors: Min Hao Yuan, Miao-Li County (TW); Chien Tsai Chueh, Miao-Li County (TW)

(73) Assignee: Coretronic Corporation, Miao-Li County (TW)

( * ) Notice: Subject to any disclaimer, the term of this patent is extended or adjusted under 35 U.S.C. 154(b) by 0 days.

(21) Appl. No.: 11/201,305

(22) Filed: Aug. 11, 2005

(65) Prior Publication Data

US 2006/0098417 A1    May 11, 2006

(30) Foreign Application Priority Data

Nov. 5, 2004  (TW) .............................. 93133822 A

(51) Int. Cl.
*H05K 9/00* (2006.01)
(52) U.S. Cl. .................. 361/818; 361/816; 361/800; 361/752; 439/79
(58) Field of Classification Search ............ 361/816, 361/818, 800, 801; 174/35 R, 51; 439/79, 439/607
See application file for complete search history.

(56) References Cited

U.S. PATENT DOCUMENTS 5,227,582 A * 7/1993 Velasco et al. ............ 174/372
6,859,371 B2 * 2/2005 Huang ........................ 361/818
2003/0223211 A1 12/2003 Huang
2004/0246693 A1 * 12/2004 Lloyd et al. ................ 361/800

FOREIGN PATENT DOCUMENTS

EP     1 372 021 A1    12/2003

\* cited by examiner

*Primary Examiner*—Tuan T. Dinh
*Assistant Examiner*—Hung S Bui
(74) *Attorney, Agent, or Firm*—Birch, Stewart, Kolasch & Birch, LLP

(57) ABSTRACT

A shielding structure for a control module installed on the surface of a rear cover of a display comprises a plurality of engaging portions disposed at both lateral sides of the control module installed on the rear cover of the display, a shielding cover in which the control module can be accepted and a plurality of engaging sheets extended from the lateral sides of the shielding cover. When the shielding cover is assembled on the rear cover, the shielding cover can be quickly fixed on or detached from the surface of the rear cover of the display through the matching engagement of the clipping portions on the rear cover and the engaging sheets.

11 Claims, 7 Drawing Sheets

SHIELDING STRUCTURE FOR A CONTROL MODULE

BACKGROUND OF THE INVENTION

1. Field of the Invention

The present invention relates to a shielding structure for a control module, and more particularly to a combination structure for conveniently assembling a shielding cover into and detaching it from a rear cover of a display.

2. Description of Related Art

As the technology develops, light weighted, electricity saving and radiation free liquid crystal displays have already replaced traditional heavy CRT screen displays and are popularly used in offices and homes.

Please refer to FIG. 1. A control module 3 constituted by a power supply 1 and control circuit board 2 of a conventional liquid crystal display (LCD) is installed on a rear cover 4 of the LCD. But, because the control module 3 exposed in air is easily interfered with by electromagnetic waves or static electricity, a shielding cover 6 is always fixed on the rear cover 4 on which the control module 3 is installed to allow the shielding cover 6 to cover the module 3 to prevent the module 3 from being interfered with by the electromagnetic waves or the static electricity.

The shielding cover 6 is generally fixed on the surface of the rear cover 6 with screws to allow the control module 3 to work normally inside of the shielding cover 6. But, a plurality of screws 7 must be used to fix the shielding cover 6 on the surface of the rear cover 4 if such fixing method is performed on the production line while assembling. The assembly procedure is very time consuming. Besides, the screws 7 must be unscrewed to allow the shielding cover 6 to be detached from the rear cover 4 during maintenance and adjustment, resulting in the waste of the working time of maintenance or an assembly person.

Therefore, how to cause the shielding cover 6 to be fixed on or detached from the surface of the rear cover 4 is the main subject of the present invention.

SUMMARY OF THE INVENTION

One object of the present invention is to provide a shielding structure for a control module, enabling a shielding cover to be fast and stably fixed and positioned on the surface of a rear cover of a display by engaging a plurality of breaches extended from the rim of the shielding cover directly into a plurality of clipping portions on the surface of the rear cover without needing screws so as to save material and assembly costs.

Another object of the present invention is to provide a shielding structure for a control module, enabling a shielding cover to be fast and stably fixed on or detached from the surface of a rear cover of a display without needing any screw by pressing and fixing a plurality of propping structure disposed at the upper end of an opening in the shielding cover on the lateral side of a terminal interface.

For attaining to the objects mentioned above, a shielding structure for a control module according to the present invention is disposed on the surface of a rear cover of a display and comprises a plurality of clipping portions disposed respectively at the two lateral sides of a control module installed on the rear cover, a shielding cover in which the control module is accepted and a plurality of engaging sheets are extended from two lateral sides of the shielding cover; when the shielding cover is assembled on the rear cover, it can be fixed on or detached from the surface of the rear cover by engaging the clipping portions and the engaging sheets.

BRIEF DESCRIPTION OF THE DRAWINGS

The present invention can be more fully understood by reference to the following description and accompanying drawings, in which.

DETAILED DESCRIPTION OF THE PREFERRED EMBODIMENTS

Figure 1:
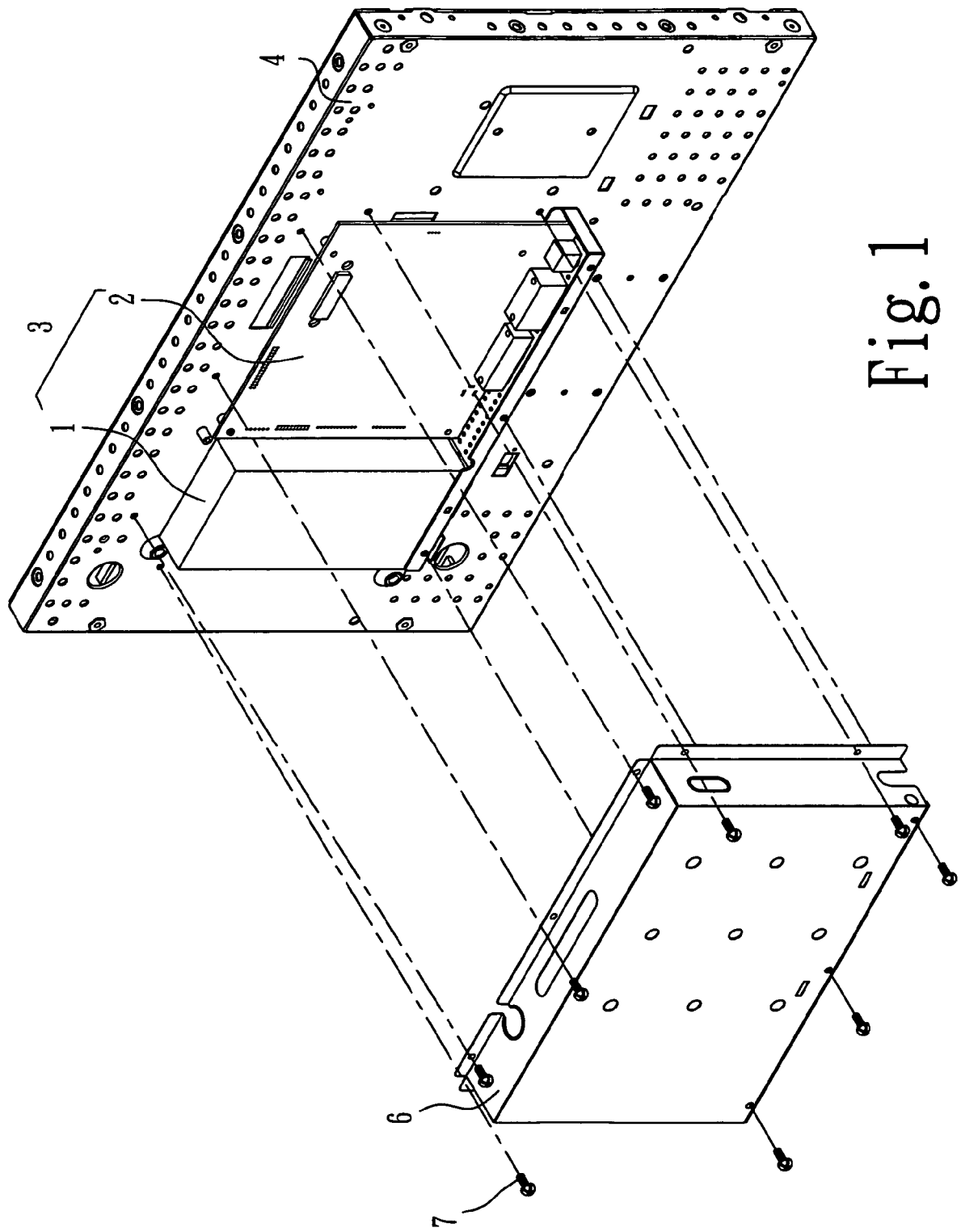
FIG. 1 is an exploded view, showing a conventional shielding cover for a control module and a rear cover.
Figure 2:
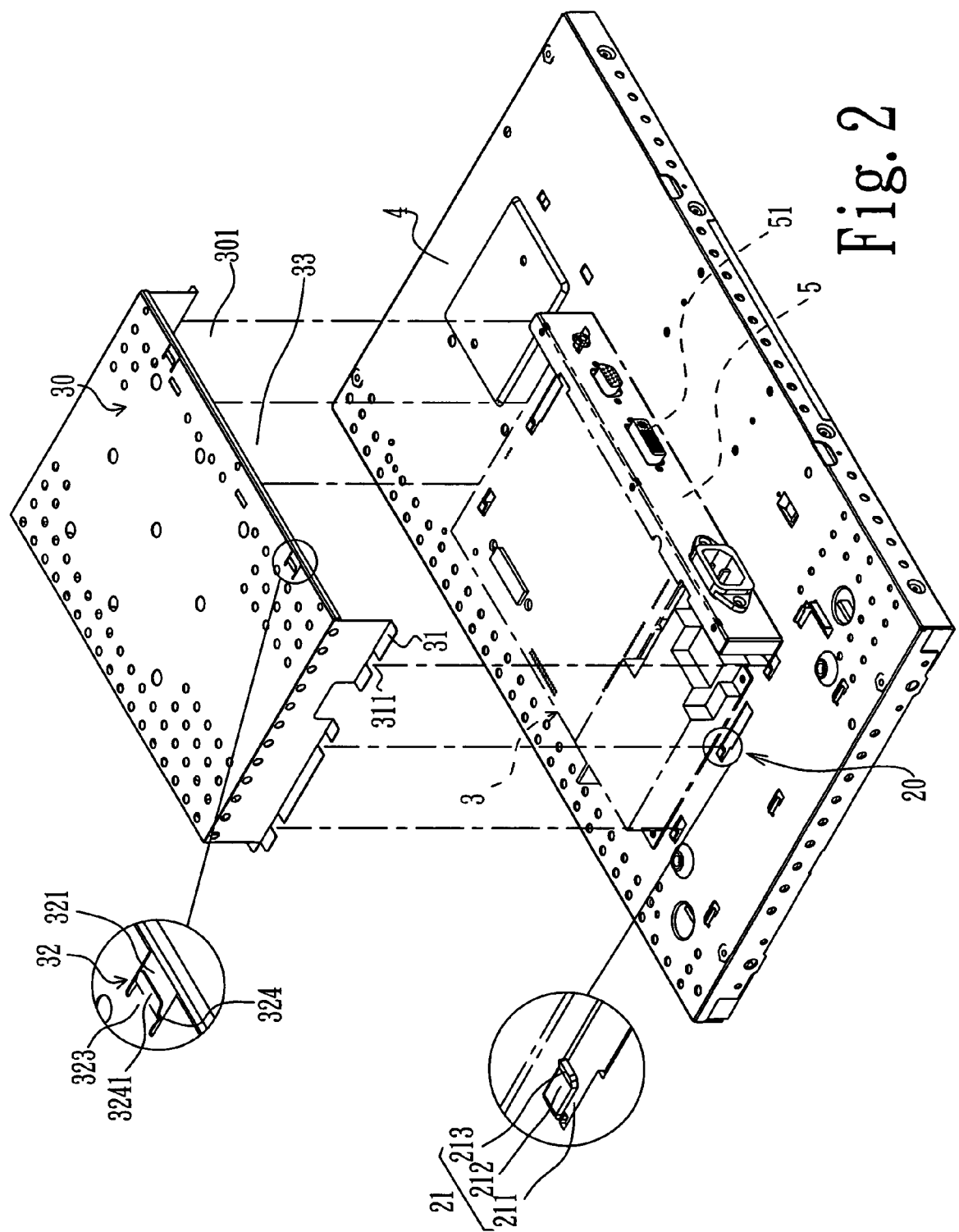
FIG. 2 is an exploded view, showing a shielding cover for a control module of a first embodiment according to the present invention.
Figure 3:
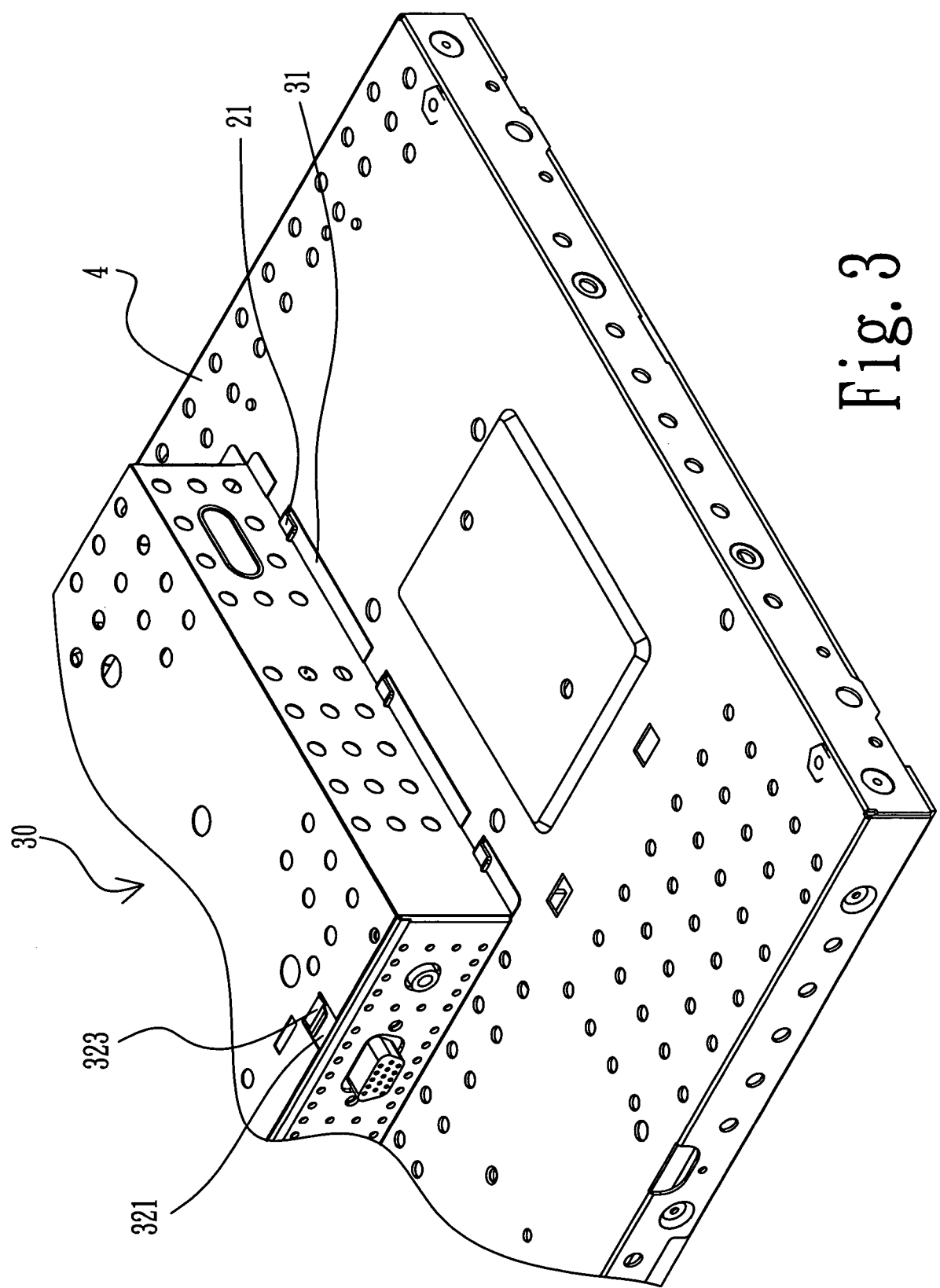
FIG. 3 is a partly perspective view, showing a shielding cover for a control module according to the present invention.
Figure 4:
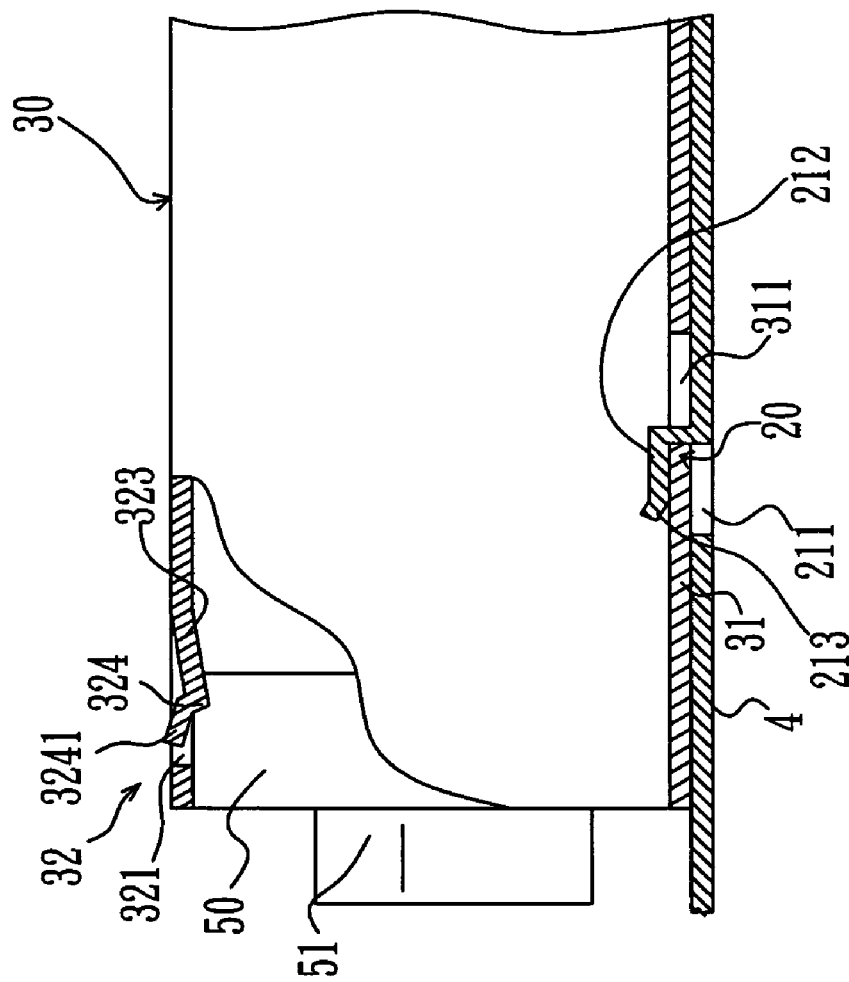
FIG. 4 is a side view, showing a shielding cover for a control module according to the present invention.

Please refer to FIGS. 2 to 4. A shielding structure comprises a plurality of clipping portions 20 disposed on the surface of the rear cover 4, a shielding cover 30 made from an electromagnetic wave resistant or static electricity resistant material and at least one propping structure 32 in which the clipping portions 20 are disposed at the two lateral sides of a control module 3. The clipping portion 20 is constituted by a clipping body 21 with a spring plate 212. One end of the spring plate 212 is connected to the rear cover 4 and the opposite end thereof is a free end having an elevation relative to the surface of the rear cover 4 so that an open type accepting space 211 is formed below the spring plate 212. The free ends of the clipping bodies 21 all face to a same direction that the shielding cover 30 is slid into the rear cover 4, i.e. all clipping bodies 21 are disposed in a same direction. A guide plate 213 with an angle of elevation inclined upward is disposed at the front end of the free end of the spring plate 212. Such kind of the guide plate 213 is used to guide the shielding cover 30 to be engaged in the accepting space 211 smoothly. A plurality of engaging plates 31 are extended respectively from the two lateral sides of the shielding cover 30 along a horizontal direction and a breach 311 is formed between each two adjacent engaging sheets 31; the position of each breach 311 is corresponding to the clipping body 21. Each engaging sheet 31 of the shielding cover 30 is allowed to engage with the surface of the rear cover 4 by engaging each breach 311 into the accepting space 211 of the clipping body 21. An accepting space 33 capable of accommodating the control module 3 exists inside of the shielding cover 30, an opening 301 is formed at the accepting space 33 and the rear side of the shielding cover 30. The terminal interface 5 at the rear side of the control module 3 can be accommodated in the opening 301 to allow terminal inlets 51 on the terminal interface 5 to be exposed outside of the accepting space 33 of the shielding cover 30. At least one propping structure 32 is disposed at the edge of the upper surface of the shielding cover 30. The propping structure 32 comprises a square through hole 321 opened in the upper surface of the shielding cover 30, and an elastic propping sheet 323 is extended slantwise downward at the side wall of the through hole 321 and the front end of the propping sheet 323 is bended an angle of elevation to form a propping portion 324. The propping portion 324 is used to prop against the upper end of the terminal interface 5 to allow the shielding cover 30 to be engaged and fixed on the surface of the rear cover 4. Besides, a pulling sheet 3241 is extended at the upper end of the propping portion 324 and a user can pull the propping sheet 323 upward through the pulling sheet 3241 to cause the propping portion 324 to be separated from the side of the terminal interface 5 propped against thereby so that the shielding cover 30 can be withdrawn form the clipping bodies engaged therewith.

A shielding structure of a control module of a preferred embodiment according to the present invention is to position each breach 311 formed between the adjacent engaging sheets 31 extended from the two sides of the shielding cover 30 at the corresponding clipping body 21 on the surface of the rear cover 4 to cause the accepting space 211 formed by the clipping body 21 to be corresponded to the lateral side of the engaging sheet 31. Thereafter, the shielding cover 30 is pushed toward the clipping body 21 so as to move the breaches 311 simultaneously to cause the engaging sheets 31 to prop respectively against the inner sides of the corresponding clipping body so as to allow the shielding cover 30 to be engaged on the surface of the rear cover 4 quickly. In the meantime, the propping sheets 323 extended slantwise downward from the square holes 321 in the upper surface of the shielding cover 30 is subjected to the contact force of at the lateral side of the terminal interface 5 to cause the elastic propping sheet 323 to be slid upward on the terminal interface 5 when the breaches 311 are moved into the accepting space 211, and the contact force provided from the lateral side of the terminal interface 5 disappear suddenly and the propping portion 324 connected to the front end of the propping sheet 323 just props against the terminal interface 5 after the elastic propping sheet 323 is recovered to its original shape when the engaging sheets contact with the inner sides of the clipping bodies and the elastic propping sheet 323 is just separated from the lateral side of terminal interface 5. Whereby, the engaging sheets 321 and the inner sides of the clipping bodies can be kept contacted to allow the shielding cover 30 to be fixed on the surface of the rear cover 4 fast and simply.

When the shielding cover 30 is detached from the surface of the rear cover 4, the pulling sheet 3241 propping against the lateral side of the terminal interface 5 is pulled synchronously only with fingers or tools to cause the propping sheet 323 to move upward to allow the propping portions 324 to be separated from the terminal interface 5 that is propped against thereby at the first place and further to allow the engaging sheets 31 and 34 to be withdrawn from the accepting space 211.

A slight warp is formed in the shielding cover 30 before assembling if tolerance is yielded in the manufacturing of the shielding cover 30. But, because the guide plate 213 is extended slantwise upward at the front end of the clipping body 21 and a guide inclined plane 2131 is so formed at the lower surface of the spring plate 212 of the clipping body 21, the slightly warped shielding cover 30 can be allowed to engage smoothly into the accepting spaces of the clipping bodies 21 and the lower surface of the shielding cover 30 is allowed to stay closely onto the surface of the rear cover 4 when the breaches 311 are engaged into the clipping bodies 21 by a push force. Therefore, the shielding cover 30 can be stayed closely to the surface of the rear cover 4 even if the slight warp exists therein.

Figure 5:
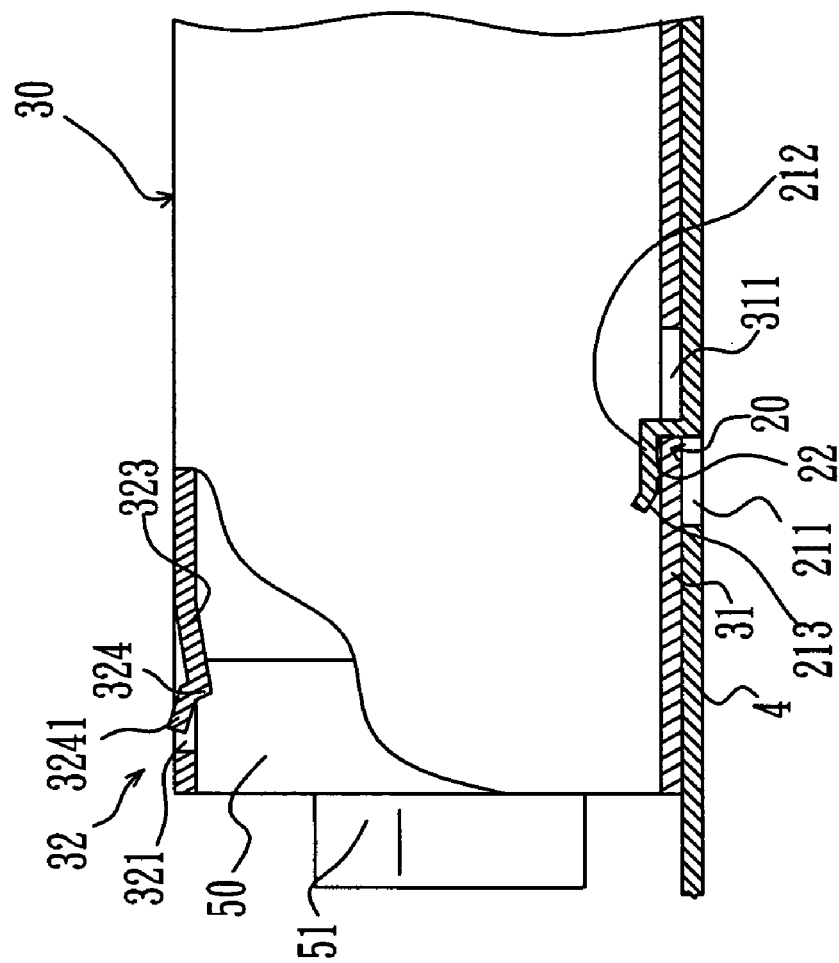
FIG. 5 is a side view, showing a shielding cover with a protrusion for a control module according to the present invention.

Furthermore, please refer to FIG. 5. A protrusion 22 is protruded at the inner side of the clipping body 21; the protrusion 22 contacts with the surface of the engaging sheet 31 in the form of a dot or a line to allow the clipping bodies 21 to press the shielding covers 30 on the surface of the rear cover 4 to avoid loosing the engaging sheets 31 in the accepting spaces 211 owing to the overlarge size of the accepting spaces 211 when the engaging sheets 31 are engaged into the accepting spaces 211.

Figure 6:
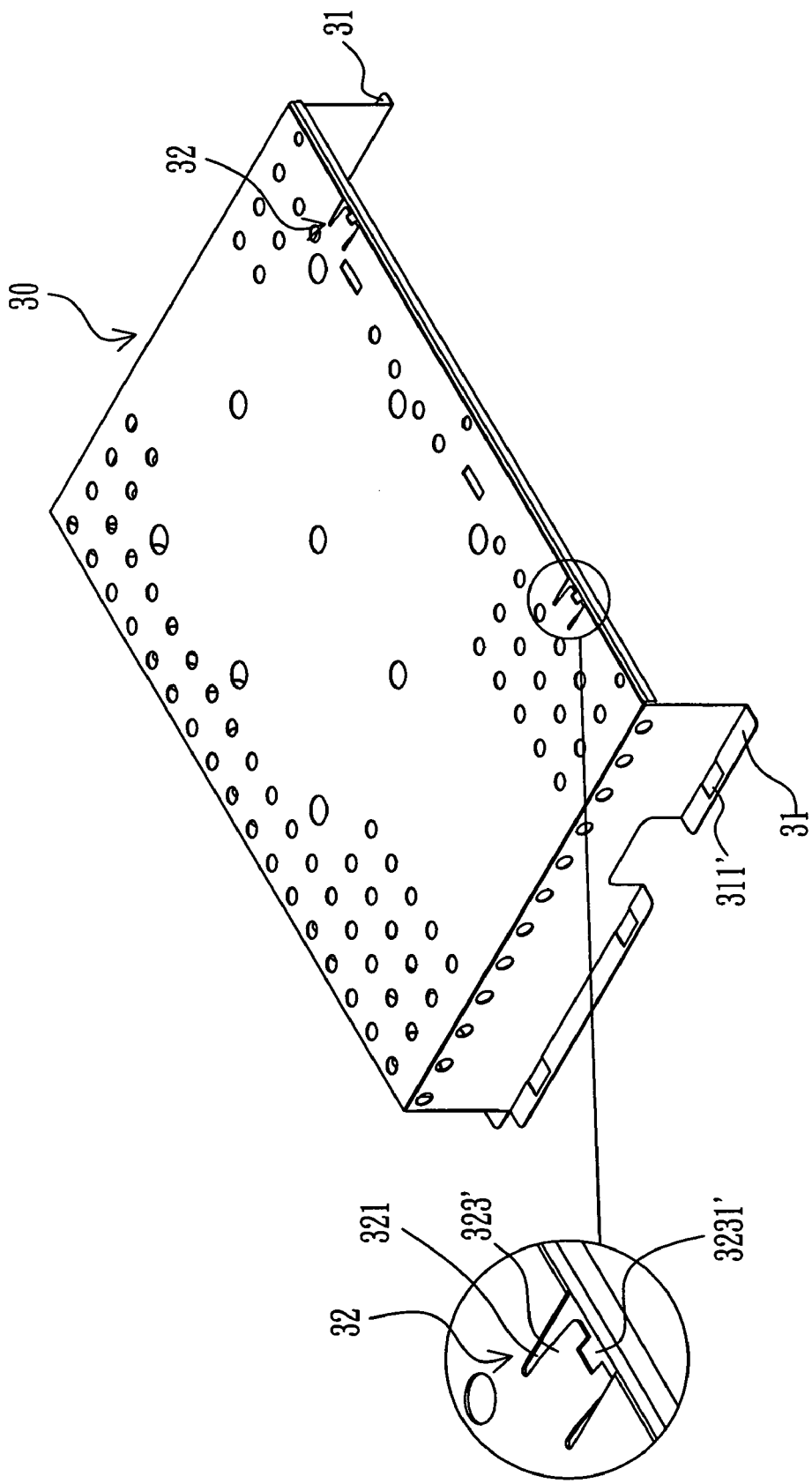
FIG. 6 is a perspective view, showing a shielding structure for a control module of a second preferred embodiment according to the present invention.

Please refer to FIG. 6. Each two adjacent engaging sheets 31 at the lateral sides of the shielding cover 30 can be connected to form a rectangular through hole 311'. The clipping body 21 can be passed through the rectangular through hole 311' to allow the engaging sheet 31 to be engaged in the accepting space 211 so as to allow the shielding cover 30 to be engaged on the surface of the rear cover 4. And an elastic propping sheet 323' is extended slantwise downward from the side wall of the rectangular 321 of the propping structure 32, and the end of the propping sheet 323' can directly prop against the side of the terminal interface 5 to allow the shielding cover 30 to be fixed and positioned continuously on the surface of the rear cover 4. Furthermore, a notch 3231' is opened in the middle of the upper end of the propping sheet 323. Therefore, when the shielding cover 30 is to be detached from the surface of the rear cover 4, only a tool is needed to pass through the notch 3231' to elevate the propping sheet 323' to withdraw it from the terminal interface 5 propped thereby at the first place and to allow the engaging sheets 31 to be withdrawn out of the accepting space 211 of the clipping bodies 21 so as to separate the shielding cover 30 from the surface of the rear cover 4.

Figure 7:
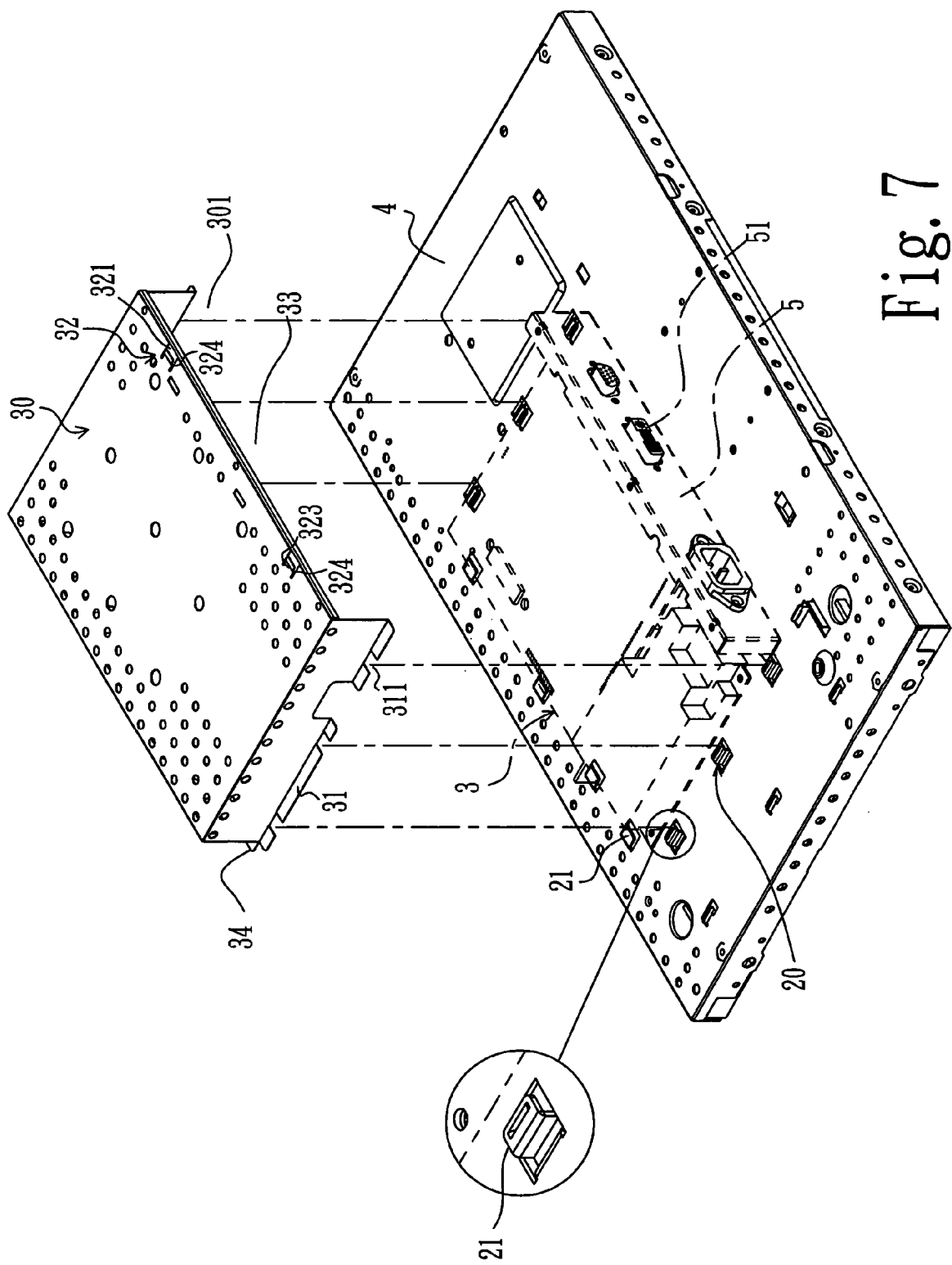
FIG. 7 is an exploded view, showing a shielding structure for a control module of a third preferred embodiment according to the present invention.

Still another preferred embodiment of the present invention according to the present invention is shown in FIG. 7. The clipping bodies 21 at the two sides of the control module 3 are all disposed face to face. Furthermore, for attaching the shielding cover 30 closely on the surface of the rear cover 4, a long engaging sheet 34 extended from the front end of the shielding cover 30 and a plurality of clipping portions 20 constituted by a clipping body 21 are also disposed at the corresponding positions on the surface of the rear cover 4. The breaches 311 at the two sides of the shielding cover 30 are respectively similarly positioned at the corresponding clipping bodies 21. In the meantime, the lateral side of the accepting space 211 faces the lateral side of the corresponding engaging sheet 31. Thereafter, a push force is exerted on the shielding cover 30 in the engagement direction to cause engaging sheets 34 extended from the front end of the shielding cover 30 to prop against the inner sides of their corresponding clipping bodies 21, and each clipping body 21 at the two lateral sides of the control module 3 can compress and accept the engaging sheet 34 simultaneously on the rear cover 4, and the engaging sheets 34 can be kept contacting with the inner sides of the clipping bodies 21 propping the propping sheets 324 against the side of the terminal interface 5 so that the shielding cover 30 can be fixed on the surface of the rear cover 4 continuously. Therefore, because the engaging sheet 34 at the front end of the shielding cover 30 and the engaging sheets 31 disposed at the lateral sides can be engaged in the clipping bodies 21 at the same time when the shielding cover 30 is assembled, the shielding cover 30 can be attached on the surface of the rear cover 4 closely, this can prevent the surface of the rear cover 4 from being warped due to the uneven distribution of the engaging forces of the clipping bodies 21.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A shielding structure for a control module installed on the surface of a rear cover of a display, comprising:
   a plurality of clipping portions distributed on the surface of said rear cover and around said control module;
   a shielding cover, at least one engaging sheet being disposed at the lateral sides of the shielding cover, said engaging sheet being respectively engaged in each said clipping portion; and
   at least one propping structure disposed on the upper surface of said shielding cover and propping against a terminal interface of said control module in a horizontal direction parallel to the surface of said rear cover so as to provide a horizontal restraining force to restrain said shielding structure from moving in said horizontal direction to avoid exploring the control module.

2. The shielding structure according to claim 1, wherein an accepting space is formed inside of said shielding cover for accepting said control module and an opening is formed at one side of said shielding cover.

3. The shielding structure according to claim 1, wherein said propping structure comprises:
   a through hole disposed in the upper surface of said shielding cover, a propping sheet being extended slantwise downward from the wall of said through hole, the front end of said propping sheet being bended upward an angle of elevation to form a propping portion; and
   a pulling sheet disposed at the front end of said propping portion.

4. The shielding structure according to claim 1, wherein said propping structure comprises a rectangular through hole disposed in the surface of said shielding cover, and a propping sheet is extended slantwise downward from the wall of said through hole, and a notch is opened in the middle of the surface of said propping sheet.

5. The shielding structure according to claim 1, wherein said clipping portion is constituted by a clipping body and an accepting space is formed between said clipping body and the surface of said rear cover.

6. The shielding structure according to claim 1, wherein said clipping portions all face to a same direction.

7. The shielding structure according to claim 1, wherein said clipping portions respectively disposed at the right and the left sides of said control module face to each other.

8. The shielding structure of claim 1, wherein a protrusion is protruded at the inner side of said clipping body and said protrusion contacts with said engaging sheet in the form of a dot or a line.

9. The shielding structure of claim 1, wherein a plurality of rectangular through holes is disposed in each said engaging sheet for said clipping portion to pass through.

10. The shielding structure according to claim 1, wherein a breach is formed between each two adjacent engaging sheets for said clipping portion to pass through.

11. The shielding structure according to claim 1, wherein the front end of said clipping portion is extended upward an angle of elevation to form a guide plate.

* * * * *